United States Patent
Watanabe

(10) Patent No.: US 7,545,223 B2
(45) Date of Patent: Jun. 9, 2009

(54) PLL CIRCUIT

(75) Inventor: Masafumi Watanabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 85 days.

(21) Appl. No.: 11/898,582

(22) Filed: Sep. 13, 2007

(65) Prior Publication Data

US 2008/0068090 A1    Mar. 20, 2008

(30) Foreign Application Priority Data

Sep. 14, 2006  (JP) .............................. 2006-249520

(51) Int. Cl.
*H03L 7/089* (2006.01)
(52) U.S. Cl. .............................. 331/17; 331/1 A; 331/8; 331/25
(58) Field of Classification Search ................. 331/1 A, 331/8, 17, 18, 25; 327/156–159; 332/127; 360/51; 375/376; 455/260
See application file for complete search history.

(56) References Cited

U.S. PATENT DOCUMENTS 6,903,585 B2 *  6/2005  Keaveney .................. 327/148

2006/0119405 A1 *  6/2006  Kobayashi .................. 327/158

FOREIGN PATENT DOCUMENTS

JP    2005-123944    5/2005

* cited by examiner

*Primary Examiner*—David Mis
(74) *Attorney, Agent, or Firm*—McGinn IP Law Group, PLLC

(57) ABSTRACT

A PLL circuit according to an embodiment of the present invention includes: a phase comparator to output an up signal and a down signal based on a phase difference between a reference clock signal and a feedback clock signal; an offset correcting circuit to correct a pulse width of at least one of the up signal and the down signal to output a modified up signal and a modified down signal; a first charge pump circuit to increase or decrease a charge pump output voltage to be output in accordance with the modified up signal and the modified down signal; a loop filter to filter out noise of the charge pump output voltage and generate a filter voltage; and a voltage-controlled oscillation circuit having an oscillation frequency controlled based on a voltage value of the filter voltage and outputting an output clock signal.

9 Claims, 12 Drawing Sheets

PLL CIRCUIT

BACKGROUND OF THE INVENTION

1. Field of the Invention

The present invention relates to a PLL circuit, and more particularly to a PLL circuit provided with an offset correcting circuit to correct a phase offset between a reference clock signal and a feedback clock signal.

2. Description of Related Art

In recent years, PLL (Phase Locked Loop) circuits have been used as an oscillation circuit incorporated into a semiconductor device in many cases. The PLL circuits control an oscillation frequency of an output signal to synchronize a phase of a reference signal with a phase of the output signal.

FIG. 13 is a block diagram of a general PLL circuit 100 as Related Art 1. As shown in FIG. 13, the PLL circuit 100 includes a phase comparator 111, a charge pump circuit 112, a loop filter 113, and a voltage-controlled oscillation circuit 114.

The phase comparator 111 compares a reference clock signal Fr with a feedback clock signal Fd obtained by feeding back an output clock signal Fo of the PLL circuit 100 and then outputs an up signal and a down signal for controlling the charge pump circuit 112. The charge pump circuit 112 outputs a current based on a pulse width difference between the up signal and the DN signal and outputs a charge pump output voltage in accordance with an amount of the output current. This current is supplied in an inflow direction or outflow direction based on the pulse width difference between the up signal and the down signal under control. The loop filter 113 accumulates charges in a capacitor in accordance with a current output from the charge pump circuit 112 and generates a voltage in accordance with the accumulated charges. The voltage is an output voltage of the charge pump circuit 112. Further, the loop filter 113 filters out RF noise and ripple noise superimposed on the charge pump output voltage. The voltage-controlled oscillation circuit 114 sends out an output clock signal Fo having a frequency corresponding to a voltage output through the loop filter 113. In addition, the output clock signal Fo is input to the phase comparator 111 as the feedback clock signal Fd.

In an ideal PLL circuit 100, if a phase of the reference clock signal Fr matches with a phase of the feedback clock signal Fd (or the output clock signal Fo), an amount of a sink current and a source current of the charge pump circuit 112 are the same. However, even if a phase of the reference clock signal Fr does not match with a phase of the feedback clock signal Fd, a sink current and a source current of the charge pump circuit 112 are not the same due to variations in circuit configuration of the charge pump circuit 112 or a transistor. In this case, the reference clock signal Fr and the feedback clock signal Fd are out of phase with each other in a stabilized state. The phase difference is called "phase offset".

Japanese Unexamined Patent Application Publication No. 2005-123944 (Related Art 2) discloses a technique of correcting the phase offset. FIG. 14 is a block diagram of a PLL circuit 200 of the Related Art 2. As shown in FIG. 14, the PLL circuit 200 includes a delay circuit 211, a phase comparator 212, a charge pump circuit 213, a loop filter 214, a voltage-controlled oscillation circuit 215, a phase correction circuit 216, and an amplifier 220.

The delay circuit 211 receives a reference clock signal Fr and a feedback clock signal Fd, and gives a delay to each of the reference clock signal Fr and the feedback clock signal Fd to output a delay reference clock signal DLY1 and a delay feedback clock signal DLY2. Then, operations of the phase comparator 212, the charge pump circuit 213, the loop filter 214, and the voltage-controlled oscillation circuit 215 are stabilized on such conditions that a sink current and a source current of the charge pump circuit 213 are substantially the same on the basis of the delay reference clock signal DLY1 and the delay clock signal DLY2.

Further, the delay circuit 211 gives a delay that is determined by the phase correction circuit 216 and the amplifier 220. The phase correction circuit 216 includes a delay circuit 217, a phase comparator 218, and a charge pump circuit 219, the circuit configurations of which are substantially the same as those of the delay circuit 211, the phase comparator 212, and the charge pump circuit 213. In this case, the delay circuit 217 receives only the reference clock signal Fr. Then, a capacitor CDM for smoothing an output voltage of the charge pump circuit 219 is used to output a voltage corresponding to the output voltage of the charge pump circuit 219 (for example, dummy charge pump output voltage VCDM). That is, the dummy charge pump output voltage simulates a voltage output from the charge pump circuit 213 if a phase of the reference clock signal Fr matches with a phase of the feedback clock signal Fd.

The amplifier 220 outputs a control signal Vcont to the delay circuit 211 and the delay circuit 217 based on a differential voltage between the dummy charge pump output voltage VCDM and a monitor voltage VC of the charge pump circuit 213. The delay circuit 211 and the delay circuit 217 determine a delay corresponding to a voltage value of the control signal Vcont.

That is, the PLL circuit 200 determines a delay of the delay circuit 211 based on the monitor voltage VC of the charge pump circuit 213 and the dummy charge pump output voltage VCDM such that a phase of the reference clock signal Fr matches with a phase of the feedback clock signal Fd. Then, a phase offset between the reference clock signal Fr and the feedback clock signal Fd is corrected by the delay circuit 211 giving an appropriate delay to the reference clock signal Fr and the feedback clock signal Fd.

However, in the PLL circuit 200 of the Related Art 2, in addition to the phase comparator 212 connected to the PLL circuit, it is necessary to provide the phase comparator 212 to the phase correction circuit 216 to generate a dummy charge pump output voltage VCDM. Thus, the PLL circuit 200 involves a problem that a circuit is upsized. Further, power supply noise is caused by operations of the phase comparator. That is, there is a problem that the power supply noise increases as the number of phase comparators increases.

SUMMARY

In one embodiment, there is provided a PLL circuit which includes: a phase comparator to output an up signal and a down signal each having a pulse width determined based on a phase difference between a reference clock signal and a feedback clock signal; an offset correcting circuit to correct a pulse width of at least one of the up signal and the down signal to output a modified up signal and a modified down signal; a first charge pump circuit to increase or decrease a charge pump output voltage to be output in accordance with the modified up signal and the modified down signal; a loop filter to filter out noise of the charge pump output voltage and generate a filter voltage; and a voltage-controlled oscillation circuit having an oscillation frequency controlled based on a voltage value of the filter voltage and outputting an output clock signal, the offset correcting circuit setting a pulse width of at least one of the modified up signal and the modified down signal such that the charge pump output voltage becomes substantially constant if a phase of the reference clock signal matches with a phase of the feedback clock signal.

According to the PLL circuit of the present invention, an offset correcting circuit that simulates a situation that a reference clock signal Fr and a feedback clock signal Fd become in phase with each other based on an up signal and a down signal output from the phase comparator to thereby determine a correction amount of pulse widths of the up signal and the down signal. As a result, even if only one phase comparator is provided, the phase offset can be adjusted. Further, since the number of phase comparator is one, it is possible to prevent an increase in power supply noise caused by operations of the phase comparator.

According to the PLL circuit of the present invention, it is possible to correct a phase offset with a small circuit.

BRIEF DESCRIPTION OF THE DRAWINGS

The above and other objects, advantages and features of the present invention will be more apparent from the following description of certain preferred embodiments taken in conjunction with the accompanying drawings, in which.

DETAIL DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
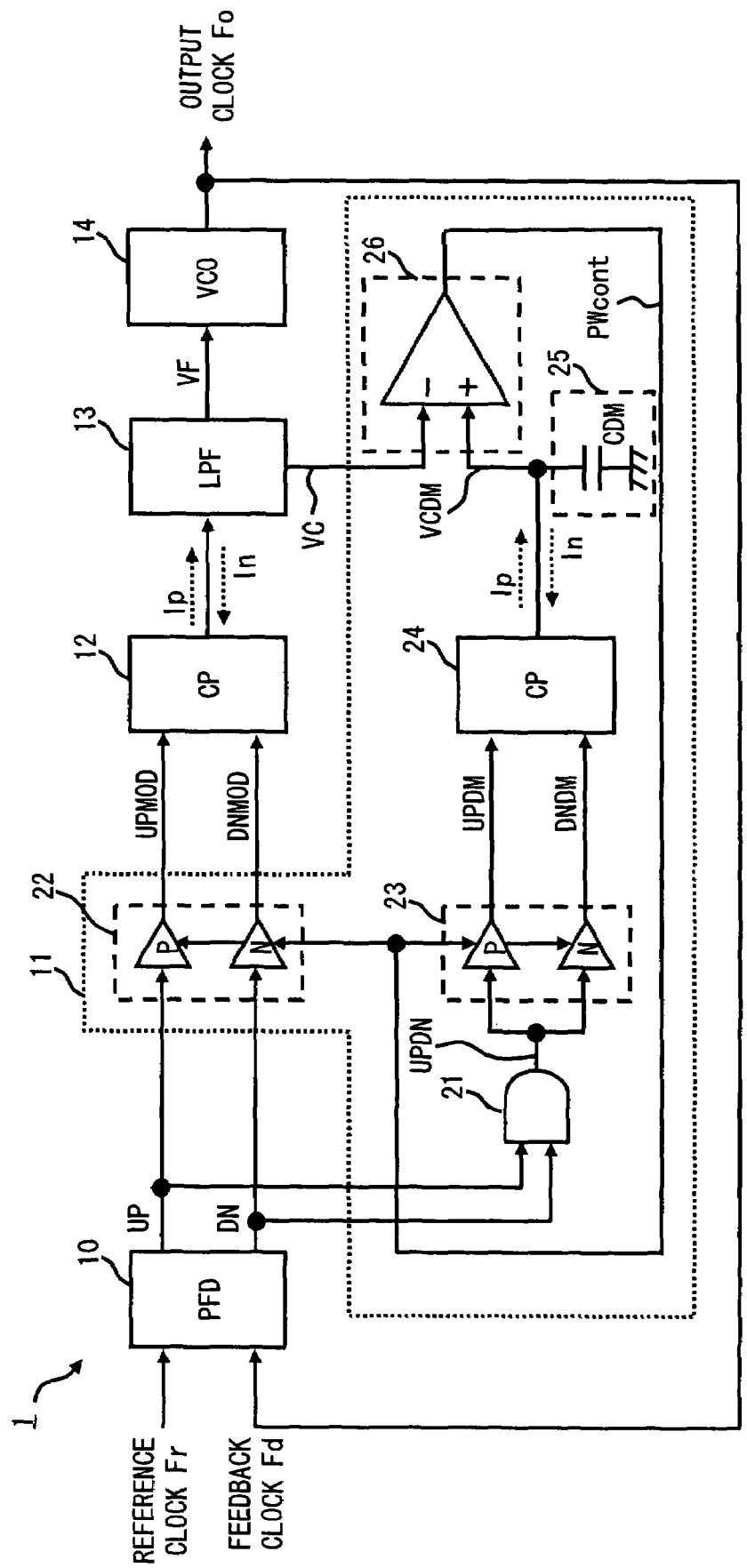
FIG. 1 is a block diagram of a PLL circuit according to a first embodiment of the present invention.

Hereinafter, embodiments of the present invention will be described with reference to the drawings. FIG. 1 is a block diagram of a PLL circuit 1 according to a first embodiment of the present invention. As shown in FIG. 1, the PLL circuit 1 includes a phase comparator 10, an offset correcting circuit 11, a first charge pump circuit 12, a loop filter 13, and a voltage-controlled oscillation circuit 14.

The phase comparator 10 compares a phase of a reference clock signal Fr with a phase of a feedback clock signal Fd obtained by feeding back an output clock signal Fo of the PLL circuit 1. Then, an up signal UP and a down signal DN each having a pulse width corresponding to a phase difference therebetween are generated. Regarding the up signal UP and down signal DN, for example, if a phase of the reference clock signal Fr leads a phase of the feedback clock signal Fd, a pulse width of the up signal UP is larger than a pulse width of the down signal DN. On the other hand, if a phase of the reference clock signal Fr lags behind a phase of the feedback clock signal Fd, a pulse width of the up signal UP is smaller than a pulse width of the down signal DN.

The offset correcting circuit 11 determines a correction amount of the pulse width of each of the up signal UP and down signal DN based on the up signal UP and down signal DN. Then, a modified up signal UPMOD and a modified down signal DNMOD with a pulse width corrected on the basis of the determined correction amount are output. At this time, the offset correcting circuit 11 simulates a situation that the reference clock signal and the feedback clock signal are in phase with each other based on the up signal UP and down signal DN, and determines a correction amount of a pulse width based on the simulated in-phase state such that an output voltage of the charge pump circuit becomes substantially constant. Incidentally, in this embodiment, a pulse width of each of the up signal UP and down signal DN is corrected, but only a pulse width of one of the up signal UP and down signal DN may be corrected. The offset correcting circuit 11 is described in detail below.

Figure 2:
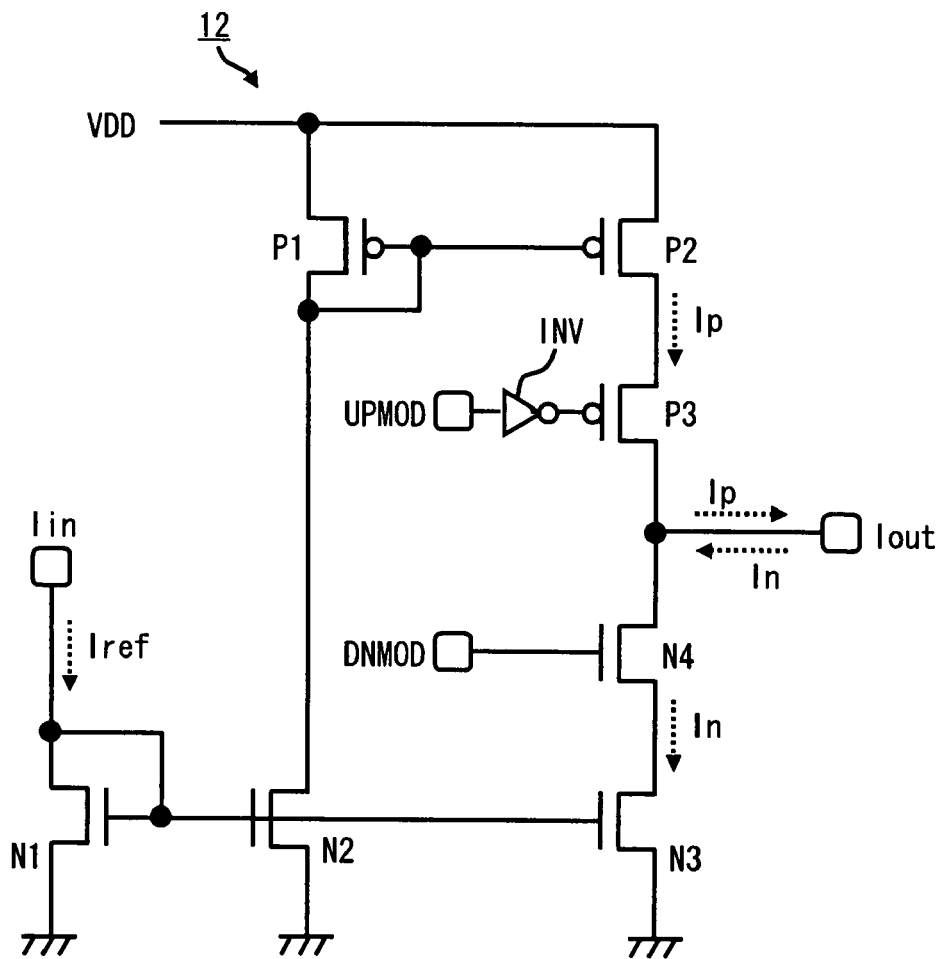
FIG. 2 is a circuit diagram of a charge pump circuit of the first embodiment.

The first charge pump circuit 12 (hereinafter simply referred to as "charge pump circuit 12") outputs a current based on a pulse width difference between the modified up signal UPMOD and the modified down signal DNMOD, and outputs a charge pump output voltage in accordance with a current amount of the output current. The current is controlled to flow in the circuit or flow out of the circuit based on a pulse width difference between the modified up signal UPMOD and the modified down signal DNMOD. FIG. 2 shows a circuit example of the charge pump circuit 12.

As shown in FIG. 2, NMOS transistors N1 to N4, PMOS transistors P1 to P3, and an inverter INV are provided. The NMOS transistor N1 has a source connected with a ground potential VSS, and a drain connected with a reference current input terminal Iin. Further, the NMOS transistor N1 has a gate and a drain connected together. Further, the NMOS transistor N1 has a gate connected to a gate of each of the NMOS transistors N2 and N3. The NMOS transistor N2 has a source connected with a ground potential VSS, and a drain connected with a drain of the PMOS transistor P1. The NMOS transistor N3 has a source connected to the ground potential VSS, and a drain connected with a source of the NMOS transistor N4. The PMOS transistor P1 has a source connected with a power supply potential VDD. Further, the PMOS transistor P1 has a gate and a drain connected together. Then, a gate of the PMOS transistor P1 and a gate of the PMOS transistor P2 are connected together. The PMOS transistor P2 has a source connected to the power supply potential VDD, and a drain connected to a source of the PMOS transistor P3. The NMOS transistor N4 has a drain connected with a drain of the PMOS transistor P3. Then, a node between the NMOS transistor N4 and the PMOS transistor P3 is connected with an output terminal Iout. Further, the modified down signal DNMOD is input to the gate of the NMOS transistor N4. The modified up signal UPMOD is input to the gate of the PMOS transistor P3 through the inverter INV.

That is, in the charge pump circuit 12, a reference current Iref input from a reference current input terminal Iin is returned by a current mirror composed of NMOS transistors N1 to N3 and a current mirror composed of PMOS transistors P1 and P2 to thereby determine currents Ip and In to be output from the output terminal Iout. At this time, the PMOS transistor P3 and the NMOS transistor N4 operate as switches for determining whether or not to output the currents Ip and In to the output terminal Iout. The PMOS transistor P3 and NMOS transistor N4 are turned on if the modified up signal UPMOD and modified down signal DNMOD are at a high level, and output the currents Ip and In from the output terminal Iout. On the other hand, if the modified up signal UPMOD and modified down signal DNMOD are at a low level, the PMOS transistor P3 and the NMOS transistor N4 are turned off, and the currents Ip and In are not output from the output terminal Iout.

Figure 3:
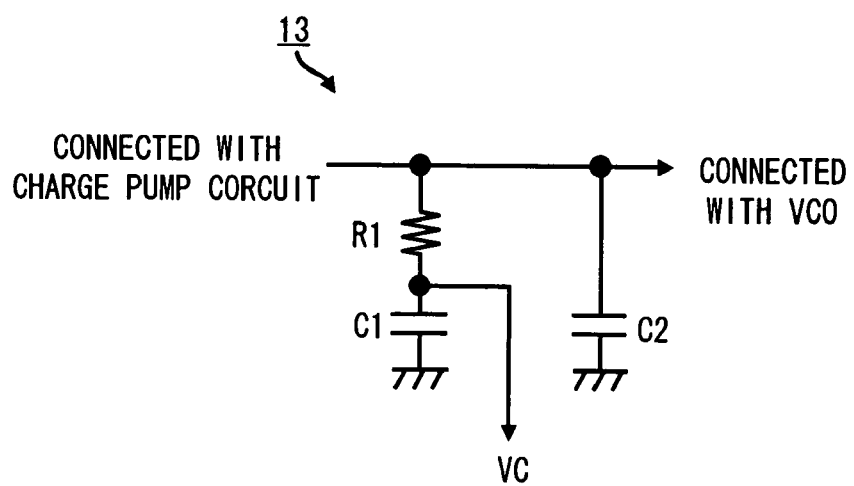
FIG. 3 is a circuit diagram of a loop filter of the first embodiment.

The loop filter 13 accumulates charges in a capacitor based on currents output from the charge pump circuit 12. Then, a voltage is generated on the basis of the accumulated charges. The voltage is output from the charge pump circuit 12. Further, the loop filter 13 filters out RF noise and ripple noise superimposed on the charge pump output voltage. Incidentally, in this embodiment, the loop filter 13 outputs two voltage signals. One voltage signal is a first filter voltage (for example, a charge pump output voltage VF) as a voltage output from the output terminal of the charge pump circuit 12, and the other voltage is a voltage that varies in accordance with a change of the charge pump output voltage signal, which is a second filter voltage (for example, a monitor voltage VC) different from the charge pump output voltage signal. FIG. 3 shows a circuit example of the loop filter 13.

As shown in FIG. 3, the loop filter 13 includes a resistor R1 and capacitors C1 and C2. The resistor R1 has one end connected to a line (for example, a first charge pump output line) connecting the output terminal of the charge pump circuit 12 with a voltage input terminal of the voltage-controlled oscillation circuit 14, and the other end connected with one end of the capacitor C1. The capacitor C1 has the other end connected with the ground potential VSS. Then, a voltage at a node between the resistor R1 and the capacitor C1 is output as the monitor voltage VC. On the other hand; the capacitor C2 is connected between the first charge pump output line and the ground potential VSS. Incidentally, a voltage of the first charge pump output line is generated on the basis of an amount of charges accumulated in the capacitors C1 and C2 and a current flowing through the resistor R1. A voltage of the first charge pump output line is a charge pump output voltage VF. That is, if a sink current and a source current to be output from the charge pump circuit 12 are substantially the same, no current flows through the resistor R1, so the monitor voltage VC and the charge pump output voltage VF can be regarded to be substantially equal. Incidentally, in this embodiment, the charge pump output voltage VF and the monitor voltage VC are output from different nodes but may be output from the same node.

The voltage-controlled oscillation circuit 14 outputs an output clock signal Fo having a frequency of the charge pump output voltage VF output through the loop filter 13. Further, the output clock signal Fo is input to the phase comparator 10 as a feedback clock signal Fd.

Here, the offset correcting circuit 11 is described in detail. As shown in FIG. 1, the offset correcting circuit 11 includes an AND circuit 21, a first pulse width control circuit 22, a second pulse width control circuit 23, a second charge pump circuit 24, a dummy filter 25, and a pulse width control signal generating circuit 26.

One input terminal of the AND circuit 21 receives an up signal UP output from the phase comparator 10, and the other input terminal receives a down signal DN output from the phase comparator 10. Then, the AND circuit 21 outputs the logical product of the up signal UP and the down signal DN as a dummy sync signal UPDN. In this embodiment, one dummy sync signal UPDN output from the AND circuit 21 is referred to as a dummy up signal or dummy down signal in accordance with where to be connected. In FIG. 1, a signal input to a buffer of the second pulse width control circuit 23, which is denoted by "P" (for example, positive buffer) is referred to as a dummy up signal, and a signal input to a buffer denoted by "N" (for example, negative buffer) is a dummy down signal.

The first pulse width control circuit 22 includes a positive buffer that receives an up signal UP, corrects a pulse width of the up signal UP, and outputs the thus-obtained modified up signal UPMOD, and a negative buffer that receives a down signal DN, corrects a pulse width of the down signal DN, and outputs the thus-obtained modified down signal DNMOD. How much the first pulse width control circuit 22 corrects the pulse width is determined on the basis of a pulse width control signal PWcont.

The second pulse width control circuit 23 includes a positive buffer that receives a dummy up signal, corrects a pulse width of the dummy up signal, and outputs the thus-obtained modified dummy up signal UPDM, and a negative buffer that receives a dummy down signal, corrects a pulse width of the dummy down signal, and outputs the thus-obtained modified dummy down signal DNDM. How much the second pulse width control circuit 23 corrects the pulse width is determined on the basis of the pulse width control signal PWcont. Incidentally, the first pulse width control circuit 22 and the second pulse width control circuit 23 have substantially the same circuit configuration. The first pulse width control circuit 22 and the second pulse width control circuit 23 are described in detail below.

The second charge pump circuit 24 (hereinafter simply referred to as charge pump circuit 24) has substantially the same circuit configuration as that of the charge pump circuit 12. Then, the charge pump circuit 24 controls an output current on the basis of a pulse width difference between the modified dummy up signal UPDM and the modified dummy down signal DNDM. The dummy filter 25 accumulates charges corresponding to the output current of the charge pump circuit 24, and outputs a voltage corresponding to the accumulated charges. The voltage is a dummy filter voltage (for example, a dummy charge pump output voltage VCDM) output from the charge pump circuit 24. Further, the dummy filter 25 smoothes an output voltage of the charge pump circuit 24.

The dummy filter 25 of this embodiment has the capacitor CDM connected between a line (for example, second charge pump output line) connecting an output terminal of the charge pump circuit 24 and a second input terminal of the pulse width control signal generating circuit 26 and the ground potential VSS. The capacitor CDM has the same capacitance value as that of the capacitor C1 of the loop filter 13, for example. Incidentally, if the monitor voltage VC is obtained from the first charge pump output line of the loop filter 13, it is preferred that the dummy filter 25 has the same configuration as that of the loop filter 13.

The pulse width control signal generating circuit 26 determines a voltage value of the pulse width control signal PWcont based on a voltage difference between the monitor voltage VC and the dummy charge pump output voltage VCDM. For example, if the monitor voltage VC is lower than the dummy charge pump output voltage VCDM, a voltage value of the pulse width control signal PWcont is increased. On the other hand, if the monitor voltage VC is higher than the dummy charge pump output voltage VCDM, a voltage value of the pulse width control signal PWcont is decreased. In this embodiment, the pulse width control signal generating circuit 26 is configured by a differential amplifier. Then, the dummy charge pump output voltage VCDM is input to a non-inverting input terminal of the differential amplifier and a monitor voltage VC is input to an inverting input terminal. This pulse width control signal PWcont is input to the first pulse width control circuit 22 and the second pulse width control circuit 23. Then, the first pulse width control circuit 22 and the second pulse width control circuit 23 adjust a pulse width of an output signal in accordance with a voltage value of the pulse width control signal PWcont.

Figure 4:
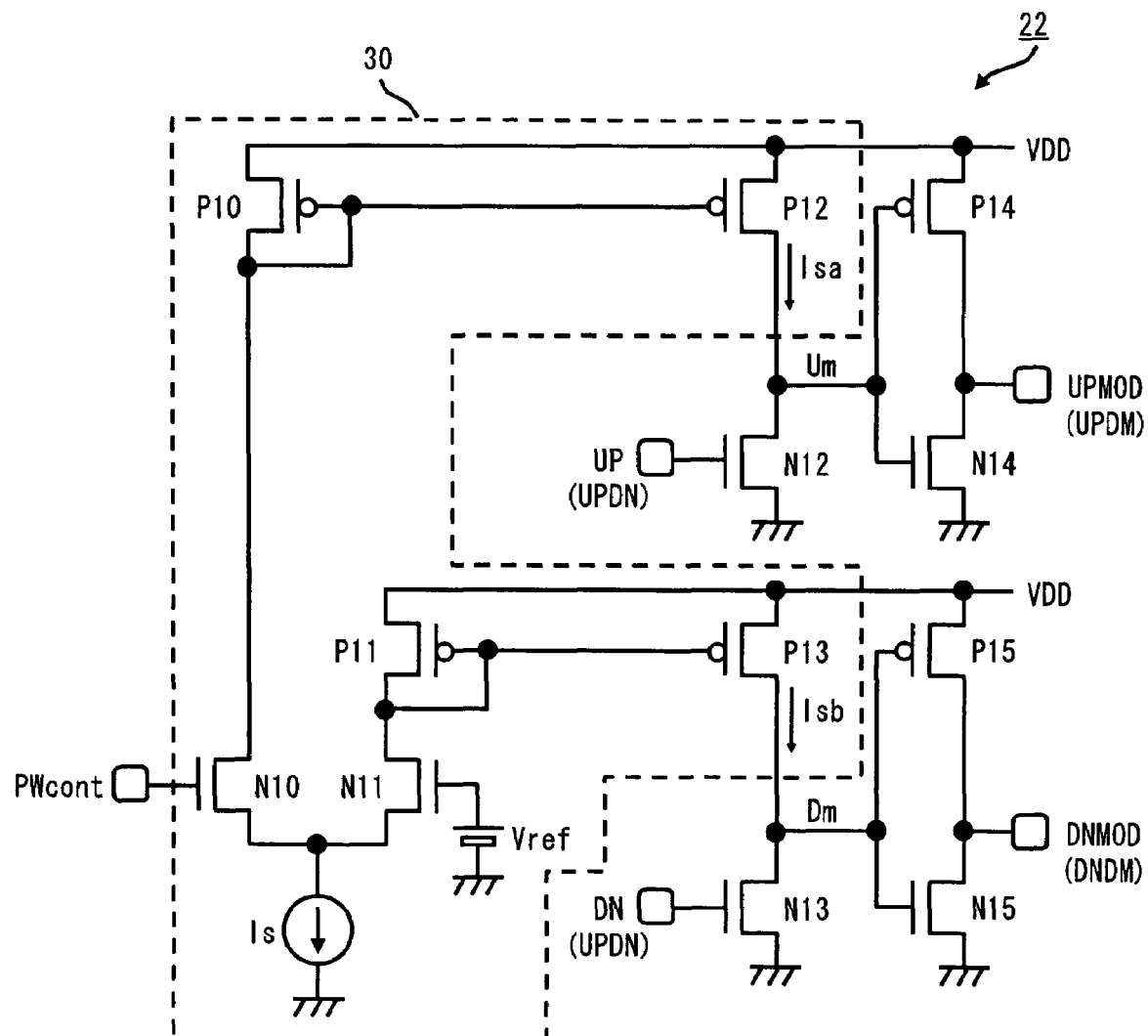
FIG. 4 is a circuit diagram of a pulse width control circuit of the first embodiment.

Here, the first pulse width control circuit 22 and the second pulse width control circuit 23 are described in detail. Incidentally, the first pulse width control circuit 22 and the second pulse width control circuit 23 have substantially the same configuration, and only the first pulse width control circuit 22 is described for illustrative purposes. FIG. 4 is a circuit diagram of the first pulse width control circuit 22. As shown in FIG. 4, the first pulse width control circuit 22 includes a current control circuit 30, NMOS transistors N12 to N15, and PMOS transistors P14 and P15. The current control circuit 30 divides a current from a current source Is into a current Isa and a current Isb in accordance with a voltage value of the pulse width control signal PWcont. The current Isa is a current output from the first output terminal of the current control circuit 30, and the current Isb is a current output from the second output terminal of the current control circuit 30.

The current control circuit 30 includes NMOS transistors N10 and N11, and PMOS transistors P10 to P13. The NMOS transistors N10 and N11 constitute a differential pair. Then, the current source Is supplies a current to the differential pair. Further, a pulse width control signal PWcont is input to the gate terminal of the NMOS transistor N10, and a constant voltage Vconst is input to the gate terminal of the NMOS transistor N11. The NMOS transistor N10 has a drain terminal connected to a drain terminal of the PMOS transistor P10. The NMOS transistor N11 has a drain terminal connected with a drain terminal of the PMOS transistor P11. The PMOS transistor P10 has a source connected with the power supply potential VDD. The PMOS transistor P10 has a gate and a drain connected together with the gate being connected to the gate of the PMOS transistor P12. Then, the PMOS transistor P12 has a source connected to the power supply potential VDD, and a drain thereof serves as the first output terminal of the current control circuit 30. The PMOS transistor P11 has a source connected to the power supply potential VDD. The PMOS transistor P11 has a gate and a drain connected together with the gate being connected to a gate of the PMOS transistor P13. Then, the PMOS transistor P13 has a source connected to the power supply potential VDD and a drain thereof serves as the second output terminal of the current control circuit 30. That is, the current control circuit 30 compares the constant voltage Vconst with a voltage value of the pulse width control signal PWcont, and determines a current ratio between the current Isa and the current Isb based on the comparison result.

Further, the NMOS transistor N12 is connected between the first output terminal of the current control circuit 30 and the ground potential VSS. The NMOS transistor N12 corresponds an input circuit of the first buffer circuit (for example, positive buffer) of the first pulse width control circuit 22. That is, the NMOS transistor N12 has a gate terminal that receives an up signal UP and a drain terminal that outputs a signal obtained by inverting the up signal UP. At this time, a rate of rise of an intermediate signal Um output from the drain terminal is determined on the basis of an amount of the current Isa output from the first output terminal of the current control circuit 30. Further, the intermediate signal Um is inverted by an output circuit (for example, inverter) composed of the PMOS transistor P14 and the NMOS transistor N14, and then output as a modified up signal UPMOD.

On the other hand, the NMOS transistor N13 is connected between the second output terminal of the current control circuit 30 and the ground potential VSS. The NMOS transistor N13 corresponds to an input circuit of the second buffer circuit (for example, negative buffer) of the first pulse width control circuit 22. That is, the NMOS transistor N13 has a gate terminal that receives a down signal DN and a drain terminal that outputs a signal obtained by inverting the down signal DN. At this time, a rate of rise of the intermediate signal Dm output from the drain terminal is determined on the basis of an amount of the current Isb output from the second output terminal of the current control circuit 30. Further, the intermediate signal Dm is inverted by an output circuit (for example, inverter) composed of the PMOS transistor P15 and the NMOS transistor N15, and the modified down signal DNMOD is output.

Figure 5:
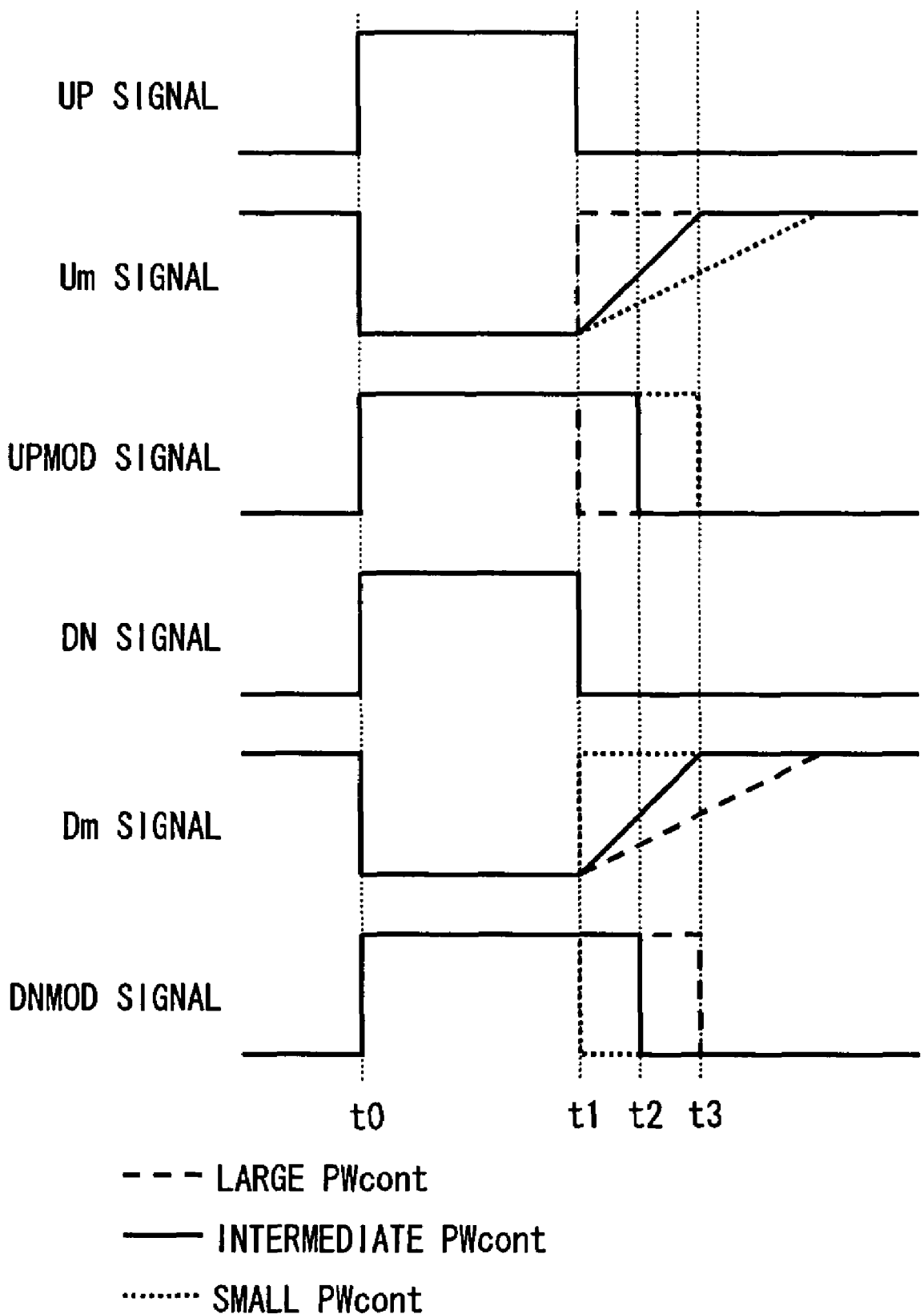
FIG. 5 is a timing chart of input/output signals of the pulse width control circuit of the first embodiment.

Here, operations of the first pulse width control circuit 22 are described. FIG. 5 is a timing chart of operations of the first pulse width control circuit 22. The timing chart of FIG. 5 includes upper three timing charts of signals on the positive buffer side and lower three timing charts of signals on the negative buffer side.

First, signals on the positive buffer side are described. On the rising edge of the up signal UP at timing t0, the intermediate signal Um falls and the modified up signal UPMOD rises. On the falling edge of the up signal UP at timing t1, the intermediate signal Um rises and the modified up signal UPMOD falls. At this time, a timing of the rising edge of the intermediate signal Um and a timing of the falling edge of the modified up signal UPMOD are changed in accordance with a voltage value of the pulse width control signal PWcont. In this embodiment, as the pulse width control signal PWcont decreases, the intermediate signal Um gently rises. Then, the rising edge of the modified up signal UPMOD appears with a larger delay. That is, as the pulse width control signal PWcont decreases, a pulse width of the modified up signal UPMOD increases.

Next, signals on the negative buffer side are described. If the down signal DN rises at timing t0, the intermediate signal Dm falls and the modified down signal DNMOD rises. Then, if the down signal DN falls at timing t1, the intermediate signal Dm rises and the modified down signal DNMOD falls. At this time, a timing of the rising edge of the intermediate signal Dm and a timing of the falling edge of the modified down signal DNMOD are changed in accordance with a voltage value of the pulse width control signal PWcont. In this embodiment, as the pulse width control signal PWcont decreases, the intermediate signal Um sharply rises. Then, the rising edge of the modified down signal DNMOD appears with a smaller delay. That is, as the pulse width control signal PWcont decreases, the pulse width of the modified down signal DNMOD decreases.

Figure 6:
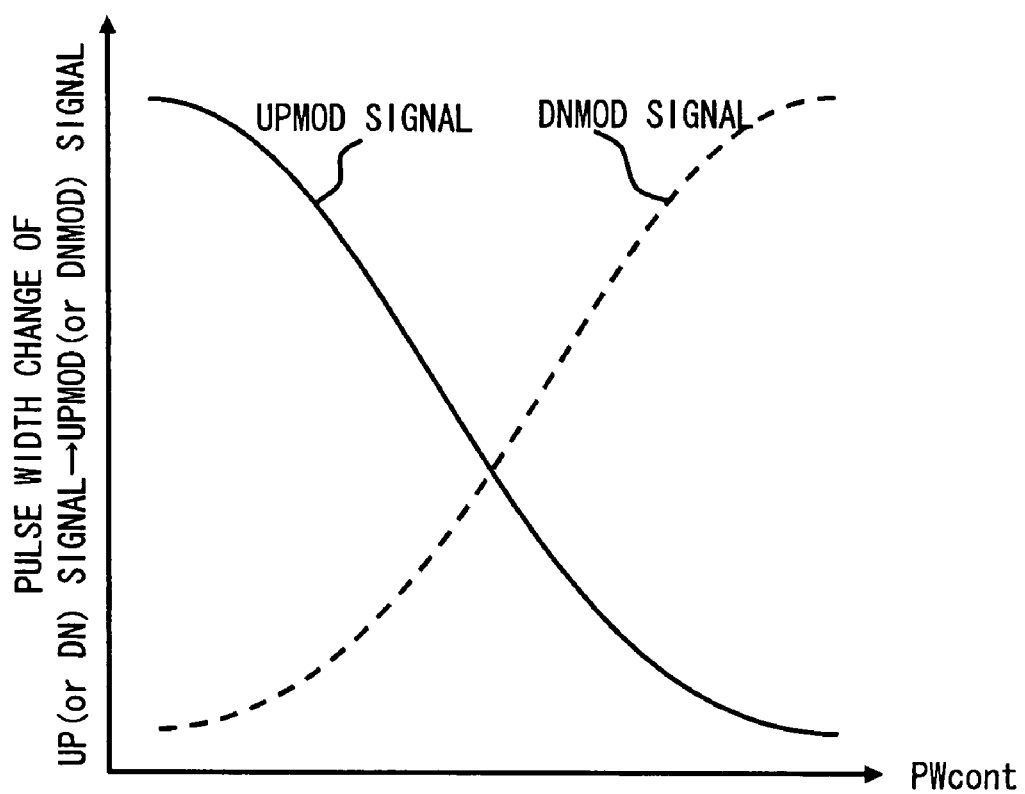
FIG. 6 is a graph showing a relationship between a pulse width of an output signal and a voltage value of a pulse width control signal in the pulse width control circuit of the first embodiment.

FIG. 6 is a graph showing a relationship between a voltage value of the pulse width control signal PWcont and a change of the pulse width between an input signal and output signal of the first pulse width control circuit 22. As apparent from the graph of FIG. 6, a change of the pulse width of the modified up signal UPMOD decreases as the pulse width control signal PWcont increases. On the other hand, a change of the pulse width of the modified down signal DNMOD increases as the pulse width control signal PWcont increases. Then, a change of the modified up signal UPMOD and a change of the modified down signal DNMOD become equal at a predetermined pulse width control signal PWcont.

Figure 7:
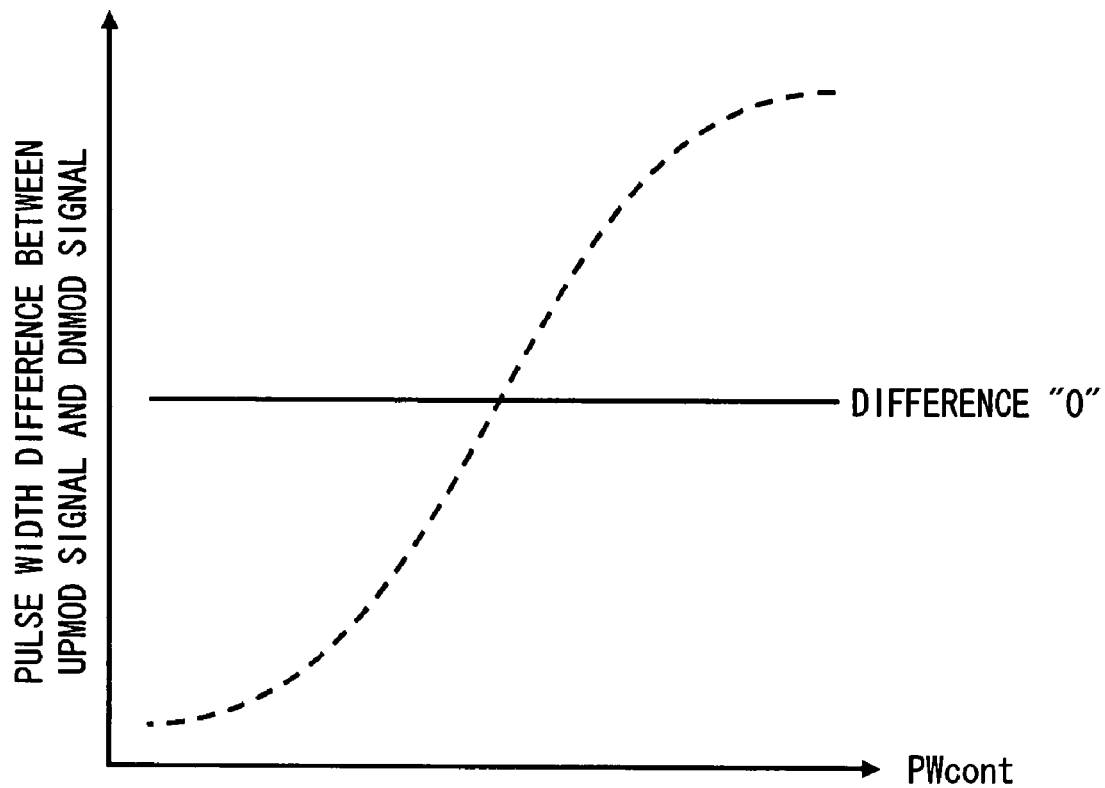
FIG. 7 is a graph showing a relationship between a pulse width of an output signal and a voltage value of a pulse width control signal in the pulse width control circuit of the first embodiment.

FIG. 7 is a graph showing a relationship between a difference between a pulse width of the modified up signal UPMOD and a pulse width of the modified down signal DNMOD and a value of the pulse width control signal PWcont. As apparent from the graph of FIG. 7, in a region where the pulse width control signal PWcont is at a low voltage level, a pulse width of the modified up signal UPMOD is larger than that of the modified down signal DNMOD. On the other hand, in a region where the pulse width control signal PWcont is at a high voltage level, a pulse width of the modified down signal DNMOD is smaller than that of the modified up signal UPMOD.

Operations of the PLL circuit 1 of this embodiment are described. Operations of the PLL circuit 1 vary depending on a ratio between the output currents Ip and In of the charge pump circuit, which is changed due to variations in transistor. Thus, operations are described in accordance with a varying ratio between the output currents Ip and In of the charge pump circuit. Incidentally, the following description is directed to operations of the PLL circuit in a locked state under the condition that the reference clock signal Fr and the feedback clock signal Fd are sync with each other.

Figure 8:
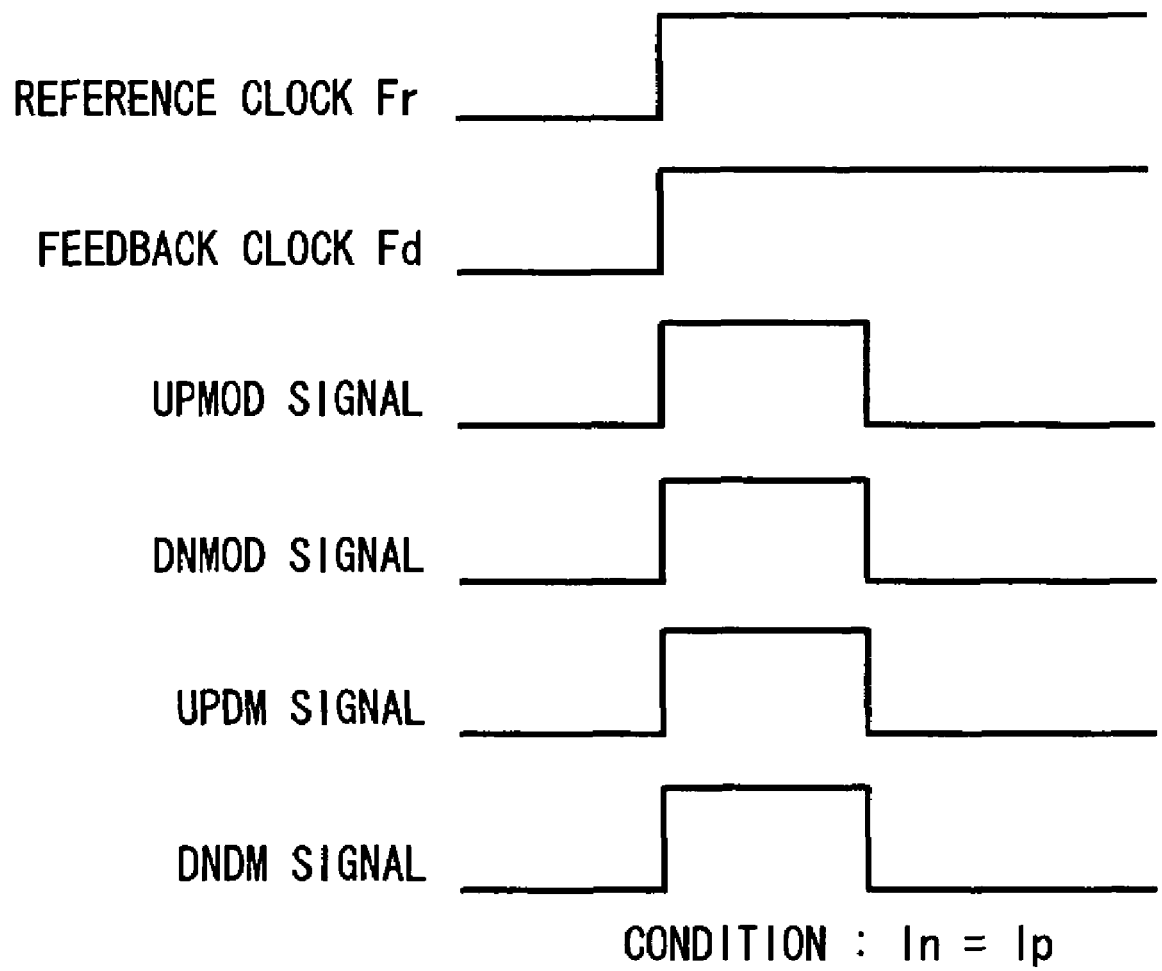
FIG. 8 is a waveform chart of a reference clock signal, a feedback clock signal, a modified up signal, and a modified down signal under first conditions in the PLL circuit of the first embodiment.

First, description is given of first conditions that output amounts of current Ip and current In per unit time are equal. Under the first conditions, if a pulse width of the modified up signal UPMOD is equal to a pulse width of the modified down signal DNMOD, a voltage value of the first charge pump output voltage is stabilized, and the reference clock signal Fr and the feedback clock signal Fd are in sync with each other. At this time, a pulse width of the modified dummy up signal UPDM is substantially the same as that of the modified dummy down signal DNDM. FIG. 8 is a flowchart of the reference clock signal Fr, the feedback clock signal Fd, the modified up signal UPMOD, the modified down signal DNMOD, the modified dummy up signal UPDM, and the modified dummy down signal DNDM under the first conditions.

Next, description is given of second conditions that an output amount of the current Ip per unit time is smaller than that of the current In per unit time. Under the second conditions, if pulse widths of the up signal UP and down signal DN are not adjusted, a phase of the feedback clock signal Fd lags behind a phase of the reference clock signal Fr in a stabilized state. That is, a phase offset occurs. At this time, the modified dummy up signal UPDM and modified dummy down signal DNDM to be input to the charge pump circuit 24 have the same pulse width before the adjustment of the pulse width, so the dummy charge pump output voltage VCDM decreases and becomes lower than the monitor voltage VC. Accordingly, the pulse width control signal PWcont decreases, and the offset correcting circuit 11 adjusts a pulse width such that a pulse width of the modified up signal UPMOD is larger than that of the modified down signal DNMOD. At this time, a pulse width of the modified up signal UPMOD is adjusted and increased, and a pulse width of the modified down signal DNMOD is adjusted and decreased. As a result, the current Ip that is decreased to set the first and second charge pump output voltage substantially constant is compensated for, and feedback control is executed such that the monitor voltage VC generated with the first charge pump output voltage becomes substantially equal to the second charge pump voltage output VCDM. Hence, the reference clock signal Fr and the feedback clock signal Fd are in phase with each other.

Figure 9:
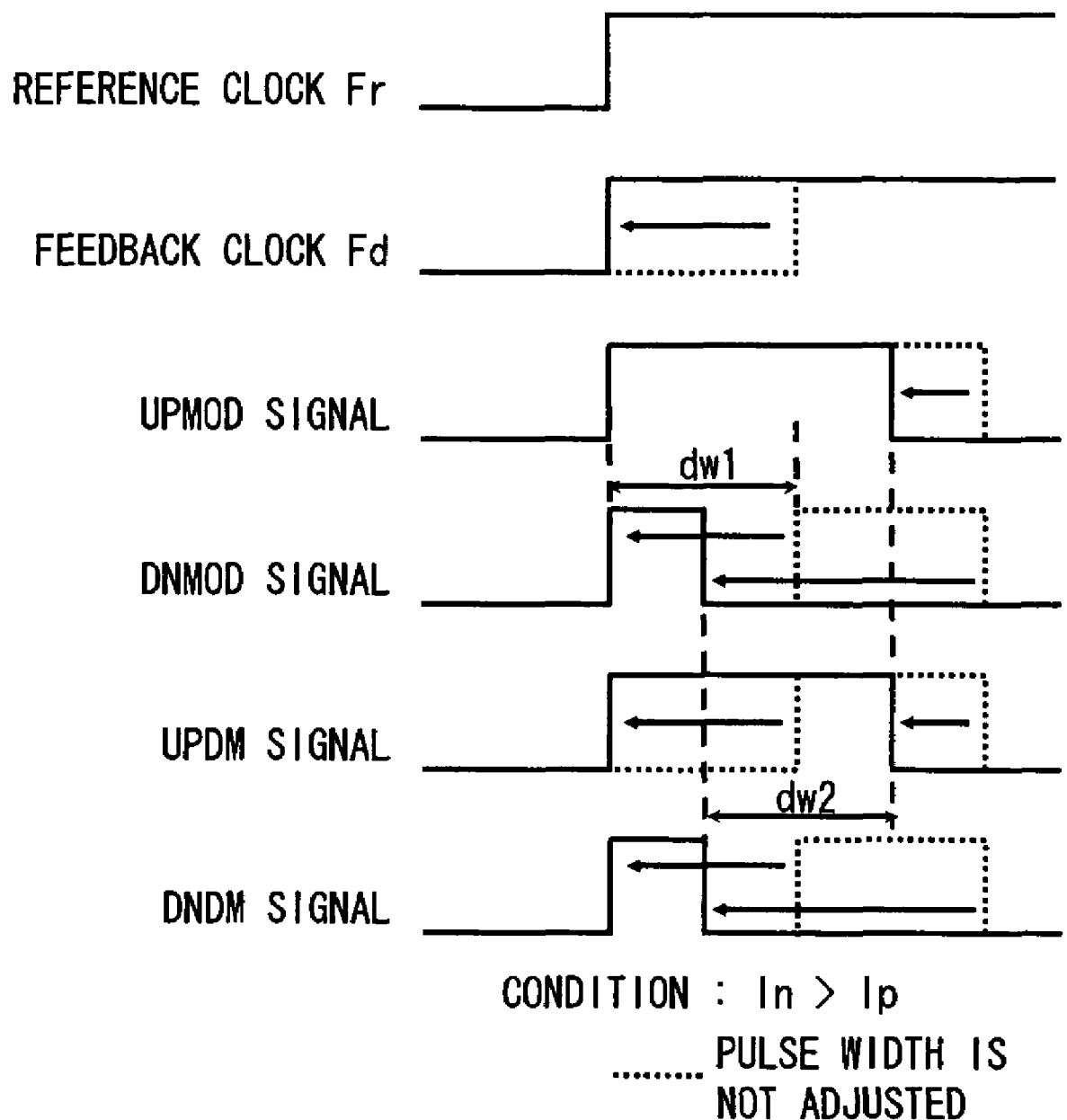
FIG. 9 is a waveform chart of a reference clock signal, a feedback clock signal, a modified up signal, and a modified down signal under second conditions in the PLL circuit of the first embodiment.

FIG. 9 is a waveform chart of the reference clock signal Fr, the feedback clock signal Fd, the modified up signal UPMOD, the modified down signal DNMOD, the modified dummy up signal UPDM, and the modified dummy down signal DNDM under the second conditions. A waveform represented by the broken line is a waveform on the assumption that a pulse width is not adjusted. Here, a pulse width difference dw1 between the UPMOD signal and the DNMOD signal before pulse width adjustment is equal to a pulse width difference (a pulse width difference between an UPDM signal and a DNDM signal) dw2 between the UPMOD signal and the DNMOD signal after pulse width adjustment. That is, if the pulse width is not adjusted, the pulse width differences become equal as a result, but if the pulse width is adjusted, a phase of the reference clock signal Fr substantially matches with a phase of the feedback clock signal Fd even if the output currents Ip and In of the charge pump circuit are not balanced. Thus, a phase offset due to the unbalanced output currents can be eliminated.

Subsequently, description is given of third conditions that an output amount of the current Ip per unit time is larger than that of the current In per unit time. Under the third conditions, if the pulse widths of the up signal UP and down signal DN are not adjusted, a phase of the feedback clock signal Fd leads a phase of the reference clock signal Fr in a stabilized state. That is, a phase offset occurs. At this time, pulse widths of the modified dummy up signal UPDM and the modified dummy down signal DNDM input to the charge pump circuit 24 become equal before the pulse width adjustment, the dummy charge pump output voltage VCDM increases and becomes higher than the monitor voltage VC. Accordingly, the pulse width control signal PWcont increases, and the offset correcting circuit 11 adjusts a pulse width such that a pulse width of the modified up signal UPMOD is smaller than that of the modified down signal DNMOD. At this time, a pulse width of the modified up signal UPMOD is adjusted and decreased, and a pulse width of the modified down signal DNMOD is adjusted and increased. As a result, an amount of the current In that is decreased to keep the first and second charge pump output voltages substantially constant is compensated for, and feedback control is executed such that the monitor voltage VC generated on the basis of the first charge pump output voltage and the second charge pump voltage output VCDM become substantially equal. Hence, the reference clock signal Fr and the feedback clock signal Fd are in phase with each other.

Figure 10:
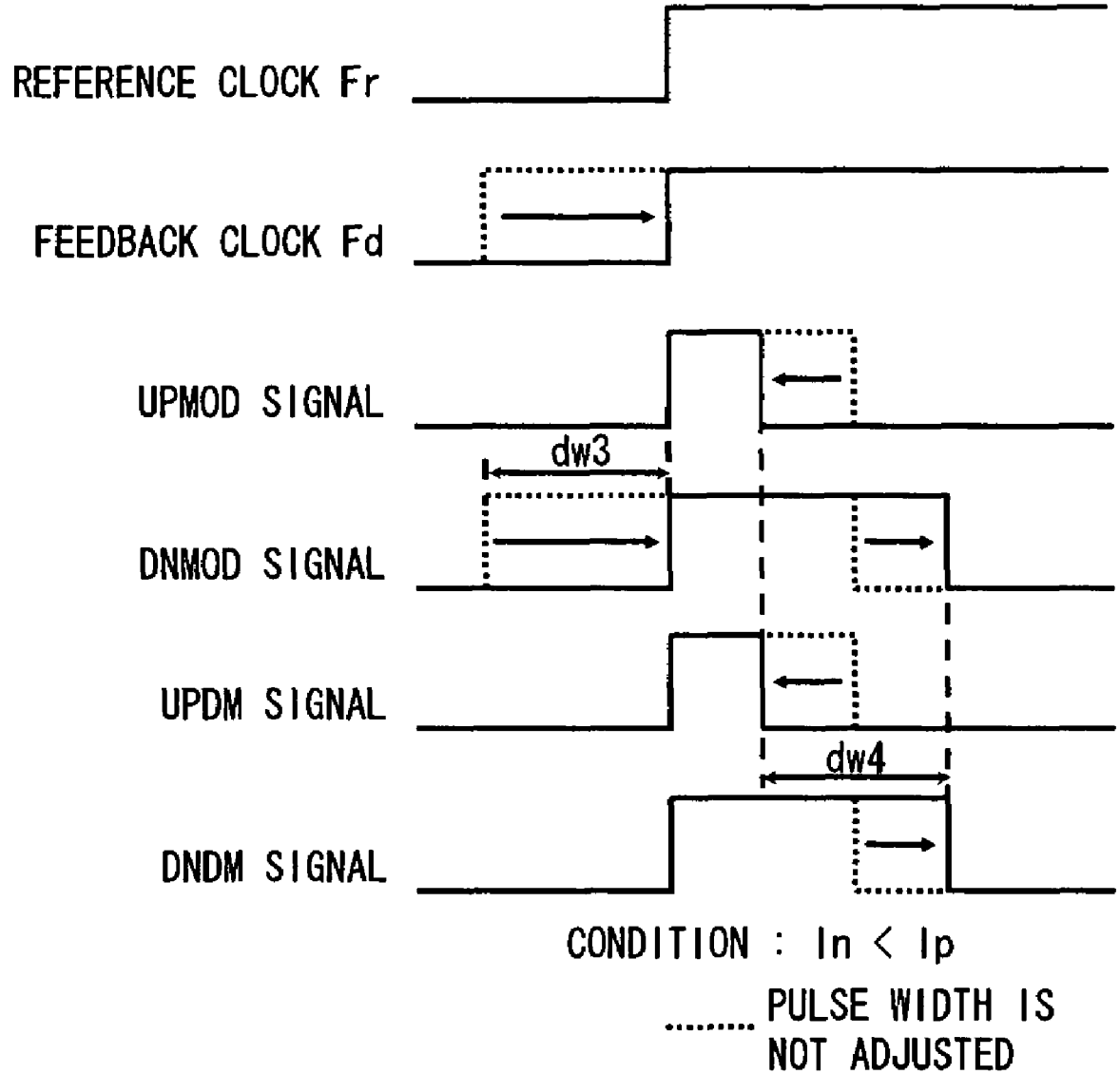
FIG. 10 is a waveform chart of a reference clock signal, a feedback clock signal, a modified up signal, and a modified down signal under third conditions in the PLL circuit of the first embodiment.

FIG. 10 is a waveform chart of the reference clock signal Fr, the feedback clock signal Fd, the modified up signal UPMOD, the modified down signal DNMOD, the modified dummy up signal UPDM, and the modified dummy down signal DNDM. A waveform represented by the broken line is a waveform on the assumption that a pulse width is not adjusted. Here, a pulse width difference dw3 between the UPMOD signal and the DNMOD signal before pulse width adjustment is equal to a pulse width difference (a pulse width difference between an UPDM signal and a DNDM signal) dw4 between the UPMOD signal and the DNMOD signal after pulse width adjustment. That is, if the pulse width is not adjusted, the pulse width differences become equal as a result, but if the pulse width is adjusted, a phase of the reference clock signal Fr substantially matches with a phase of the feedback clock signal Fd even if the output currents Ip and In of the charge pump circuit are not balanced. Thus, a phase offset due to the unbalanced output currents can be eliminated.

As understood from the above, according to the PLL circuit 1 of this embodiment, the offset correcting circuit 11 simulates a charge pump output voltage at which the reference clock signal Fr and the feedback clock signal Fd become in phase with each other as a dummy charge pump output voltage. Then, pulse widths of the up signal UP and down signal DN are adjusted to keep the dummy charge pump output voltage at a constant level. The charge pump circuit 12 operates based on the modified up signal UPMOD and modified down signal DNMOD to thereby stabilize the charge pump output voltage when a phase of the reference clock signal Fr matches with a phase of the feedback clock signal Fd. That is, the up signal UP and down signal DN are corrected on the basis of a correction amount with the offset correcting circuit 11, and the feedback clock signal Fd is generated based on the adjusted up signal and down signal, with the result that the reference clock signal Fr and the feedback clock signal Fd are in phase with each other in a locked state.

That is, in this embodiment, even if the output currents Ip and In of the charge pump circuit are not balanced, the offset correcting circuit adjusts pulse widths of the up signal and down signal to be input to the charge pump circuit to make up for the unbalanced output currents, and the reference clock signal and the feedback clock signal can be synchronized while being in phase with each other.

Further, the offset correcting circuit 11 of this embodiment calculates an amount of correction of a pulse width based on the up signal UP and down signal DN to be output from one phase comparator 10 and adjusts the pulse width. That is, it is unnecessary to provide two phase comparators as in the Related Art 2. Accordingly, according to the offset correcting circuit 11 of this embodiment, the output clock signal Fo having a phase offset corrected can be generated with a smaller circuit area.

Further, since one phase comparator suffices therefor, power supply noise caused by operations of the phase comparator can be reduced as compared with the PLL circuit of the Related Art 2. That is, the power supply noise is small, so it is possible to prevent the PLL circuit 1 from being unstable due to the power supply noise. For example, although jitter or the like occurs in the output clock signal Fo due to the power supply noise, the power supply noise is small, so the jitter can be lowered.

Second Embodiment

Figure 11:
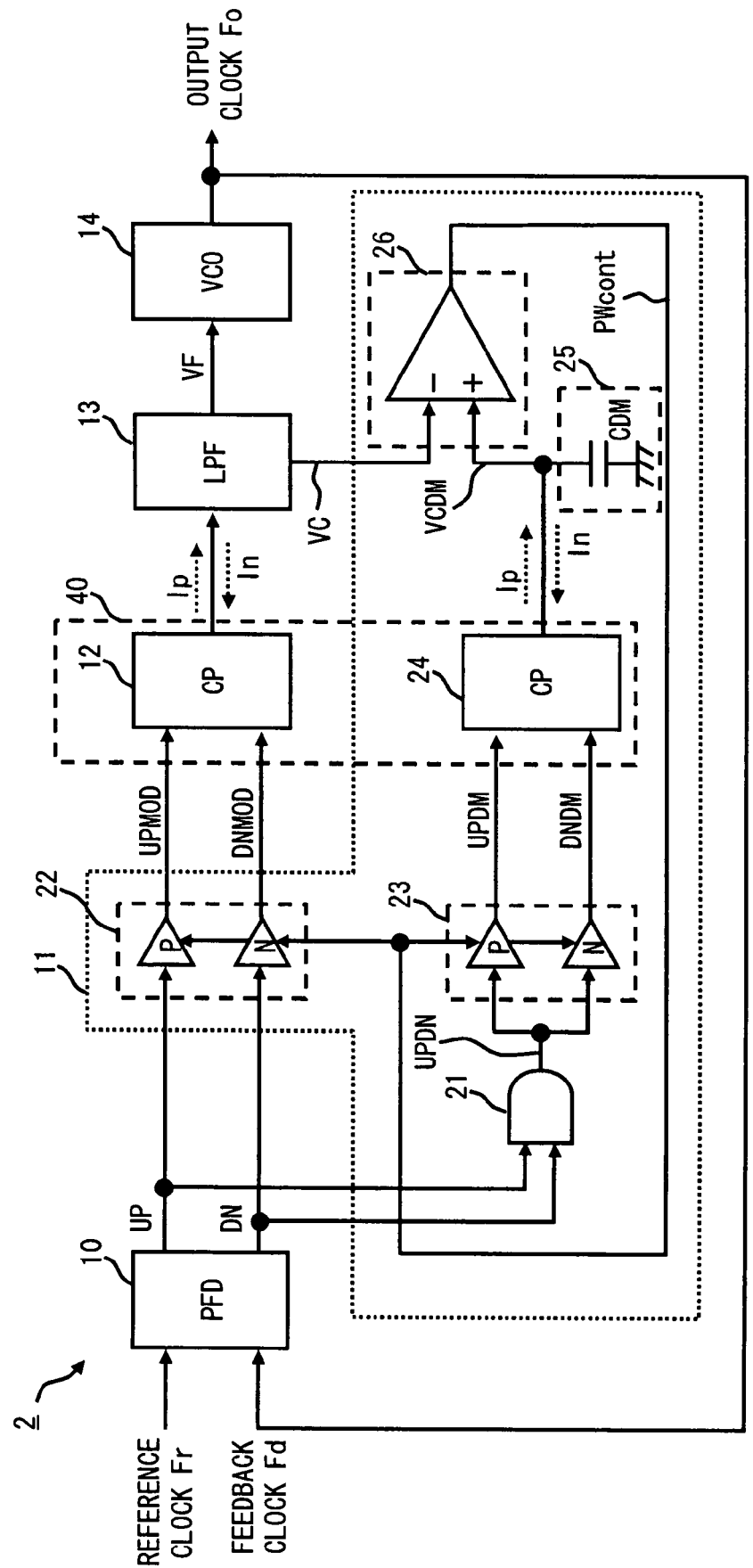
FIG. 11 is a block diagram of a PLL circuit according to a second embodiment of the present invention.

In the PLL circuit 1 of the first embodiment, the first charge pump circuit 12 and the second charge pump circuit 24 in the offset correcting circuit can operate with currents from different current sources. In contrast, in a PLL circuit 2 according to a second embodiment of the present invention, the first charge pump circuit 12 and the second charge pump circuit 24 of the offset correcting circuit can operate with currents from the same current source. FIG. 11 is a block diagram of the PLL circuit 2 according to a second embodiment of the present invention.

Figure 12:
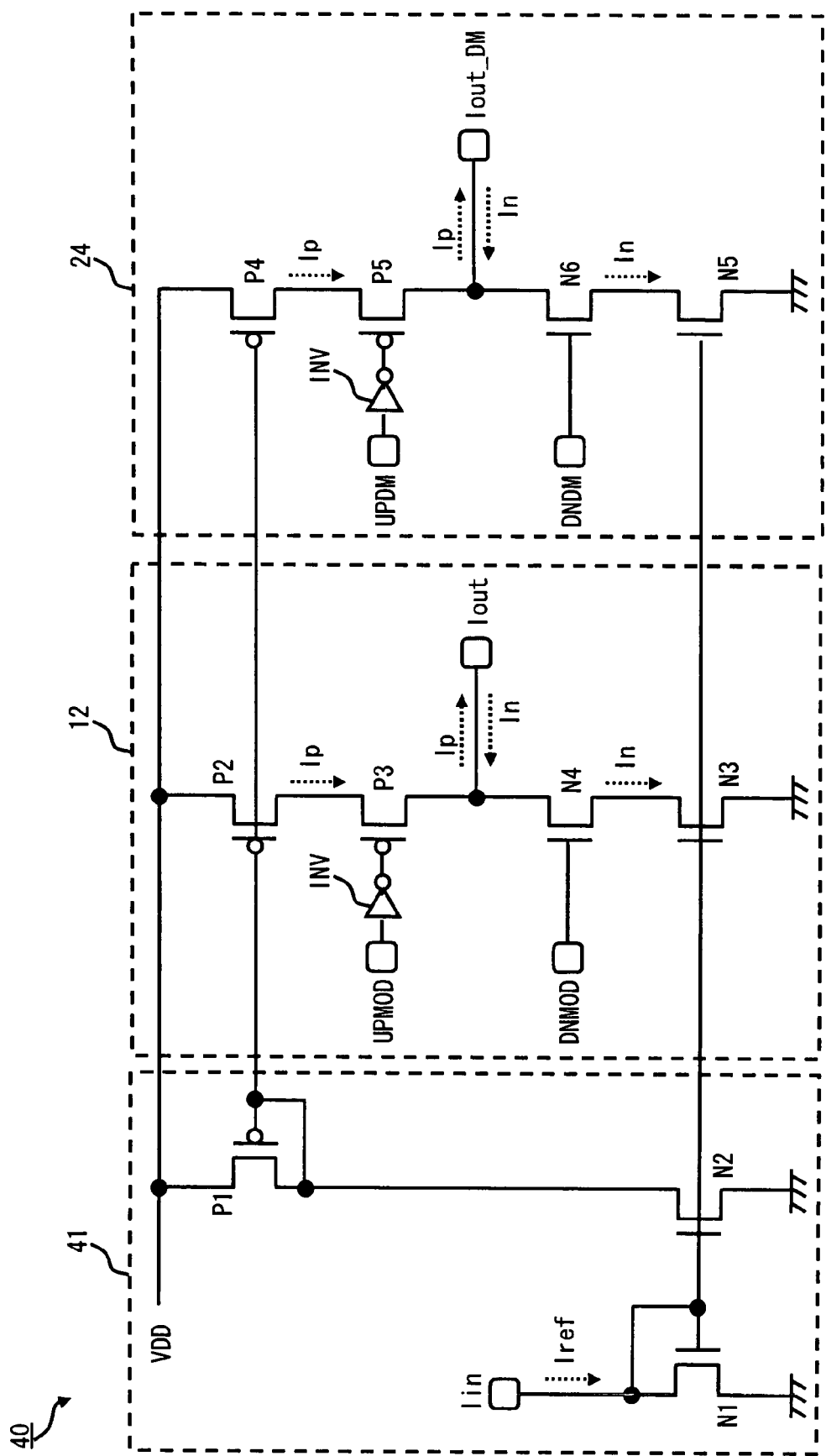
FIG. 12 is a circuit diagram of a charge pump circuit of the second embodiment.
Figure 13:
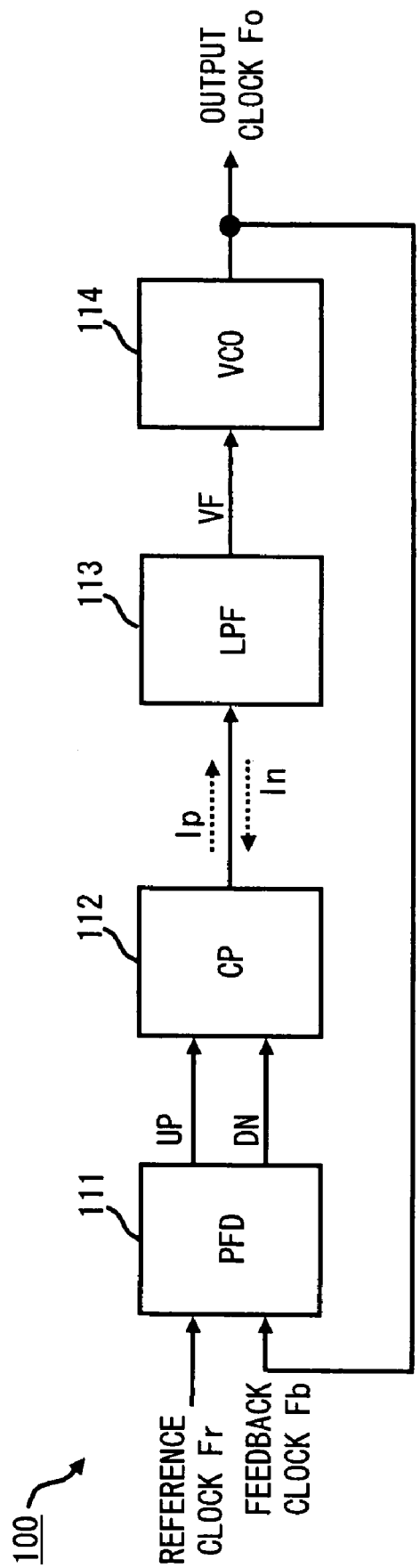
FIG. 13 is a block diagram of a PLL circuit of the Related Art 1.
Figure 14:
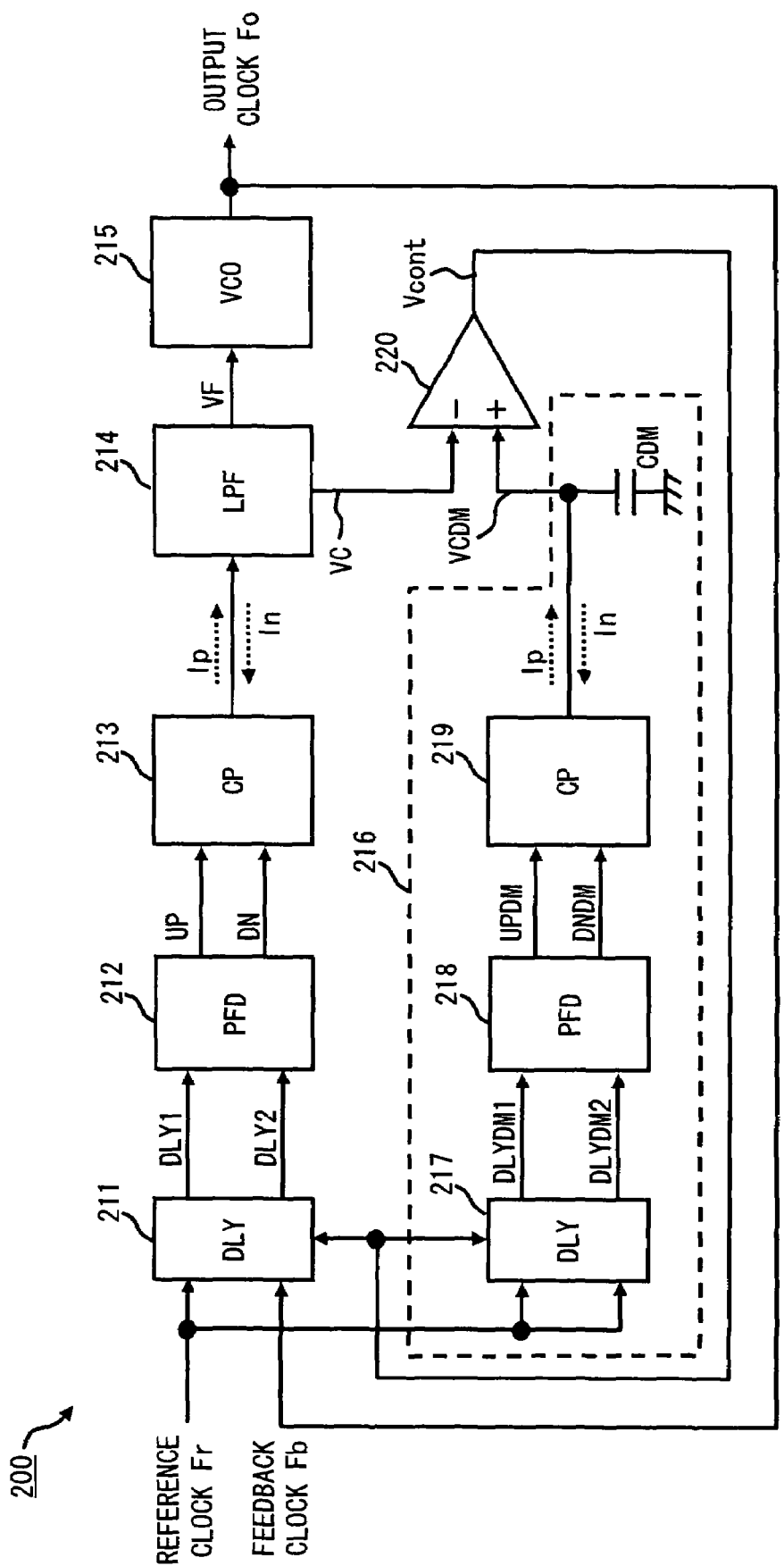
FIG. 14 is a block diagram of a PLL circuit of the Related Art 2.

As shown in FIG. 11, the PLL circuit 2 includes a charge pump circuit 40 where the first charge pump circuit 12 and the second charge pump circuit 24 share a current source. FIG. 12 is a circuit diagram of the charge pump circuit 40. As shown in FIG. 12, the charge pump circuit 40 includes a current source unit 41, a first charge pump circuit 12, and a second charge pump circuit 24. The output current Ip of the first charge pump circuit 12 and the output current Ip of the second charge pump circuit 24 are supplied as the reference current Iref returned by a current mirror composed of the NMOS transistors N1 and N2 and a current mirror composed of PMOS transistors P1, P2, and P4. On the other hand, the output current In of the first charge pump circuit 12 and the output current In of the second charge pump circuit 24 are supplied as the reference current Iref returned by a current mirror composed of the NMOS transistors N1, N3, and N5.

That is, output currents of the first charge pump circuit 12 and the second charge pump circuit 24 are supplied from the same current source through the current mirror. As a result, even if an amount of current from the current source varies, the output current of the first charge pump circuit 12 and the output current of second charge pump circuit 24 are changed at the same rate to the variation. That is, even if an amount of current from the current source varies, a relationship between the output current of the first charge pump circuit 12 and the output current of the second charge pump circuit 24 is not changed. Hence, according to the PLL circuit 2 of the second embodiment, the pulse width can be adjusted with high accuracy irrespective of variations of an amount of current from current source. In other words, the offset correcting circuit 11 of the second embodiment can calculate a correction amount of the first charge pump circuit 12 with high accuracy.

As another embodiment of the present invention, at least one of the up signal and the down signal only needs to be corrected, and it is unnecessary to correct both of the up signal and the down signal.

It is apparent that the present invention is not limited to the above embodiment but may be modified and changed without departing from the scope and spirit of the invention.

What is claimed is:

1. A PLL circuit, comprising:
   a phase comparator to output an up signal and a down signal each having a pulse width determined based on a phase difference between a reference clock signal and a feedback clock signal;
   an offset correcting circuit to correct a pulse width of at least one of the up signal and the down signal to output a modified up signal and a modified down signal;
   a first charge pump circuit to increase or decrease a charge pump output voltage to be output in accordance with the modified up signal and the modified down signal;
   a loop filter to filter out noise of the charge pump output voltage and generate a filter voltage; and
   a voltage-controlled oscillation circuit having an oscillation frequency controlled based on a voltage value of the filter voltage and outputting an output clock signal,
   the offset correcting circuit setting a pulse width of at least one of the modified up signal and the modified down signal such that the charge pump output voltage becomes substantially constant if a phase of the reference clock signal matches with a phase of the feedback clock signal.

2. The PLL circuit according to claim 1, wherein the offset correcting circuit includes:

a first pulse width control circuit to determine a correction amount of each of the input up signal and down signal in accordance with a pulse width control signal and output the modified up signal and down signal with a pulse width determined in accordance with the determined correction amount to the first charge pump;

a dummy signal generating circuit to generate the dummy up signal and the dummy down signal that simulate the up signal and the down signal that are generated in accordance with the reference clock signal and the feedback clock signal that are in phase with each other;

a second pulse width control circuit to apply the same correction as the first pulse width control circuit to the dummy up signal and dummy down signal in accordance with the pulse width control signal to generate and output modified dummy up signal and modified dummy down signal;

a second charge pump circuit to increase or decrease a dummy charge pump output voltage to be output based on the modified dummy up signal and modified dummy down signal;

a dummy filter to filter out noise of the dummy charge pump output voltage and generate a dummy filter voltage; and a pulse width control signal generating circuit to generate the pulse width control signal in accordance with a voltage difference between the filter voltage and the dummy filter voltage.

3. The PLL circuit according to claim 2, wherein the dummy signal generating circuit generates the dummy up signal and the dummy down signal based on logical product of the up signal and the down signal.

4. The PLL circuit according to claim 2, wherein the first and second pulse width control circuits include:

a current control circuit to change a ratio between a first current, a second current, and a third current in accordance with a value of the pulse width control signal;

a first buffer circuit to change a timing of at least one of a rising edge and a falling edge of an output signal in accordance with a current amount of the first current; and a second buffer circuit to change a timing of at least one of a rising edge and a falling edge of an output signal in accordance with a current amount of the second current.

5. The PLL circuit according to claim 2, wherein the pulse width control signal generating circuit is an amplifying circuit to amplify a voltage difference between the charge pump output voltage and the dummy charge pump output voltage.

6. The PLL circuit according to claim 2, wherein the first and second charge pump circuit determines a current amount of an output current in accordance with a current supplied from the same current source.

7. The PLL circuit according to claim 2, wherein the loop filter includes a resistor having one end connected to an output terminal of the first charge pump, and a capacitor having one end connected to the resistor and the other end connected to a ground potential, and generates a first filter voltage to be supplied from the one end of the resistor to the voltage-controlled oscillation circuit and generates a second filter voltage to be supplied from a node between the resistor and the capacitor to the pulse width control signal generating circuit.

8. The PLL circuit according to claim 1, wherein the first and second charge pump circuit determines a current amount of an output current in accordance with a current supplied from the same current source.

9. A PLL circuit comprising:

a phase comparator to output an up signal and a down signal each having a pulse width determined based on a phase difference between a reference clock signal and a feedback clock signal;

an offset correcting circuit to correct a pulse width of at least one of the up signal and the down signal to output a modified up signal and a modified down signal;

a first charge pump circuit to increase or decrease a charge pump output voltage to be output in accordance with the modified up signal and the modified down signal;

a loop filter to filter out noise of the charge pump output voltage and generate a filter voltage; and a voltage-controlled oscillation circuit having an oscillation frequency controlled based on a voltage value of the filter voltage and outputting an output clock signal, the offset correcting circuit simulating a situation that the reference clock signal and the feedback clock signal are in phase with each other, determining a correction amount of a pulse width such that the charge pump output voltage becomes substantially constant based on the simulated in-phase state, and setting a pulse width of at least one of the modified up signal and the modified down signal based on the correction amount.

* * * * *